(12) United States Patent
Dietrich et al.

(10) Patent No.: US 6,275,445 B1
(45) Date of Patent: Aug. 14, 2001

(54) SYNCHRONOUS INTEGRATED MEMORY

(75) Inventors: Stefan Dietrich, Türkenfeld; Peter Schrögmeier, München; Torsten Partsch, München; Christian Weis, München, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/617,649

(22) Filed: Jul. 17, 2000

(30) Foreign Application Priority Data

Jul. 16, 1999 (DE) ................................. 199 33 540

(51) Int. Cl.[7] ........................................... G11C 8/00
(52) U.S. Cl. ............... 365/233; 365/189.01; 365/230.03
(58) Field of Search .................. 365/233, 189.01, 365/230.03

(56) References Cited

U.S. PATENT DOCUMENTS

| 5,404,338 | * | 4/1995 | Murai et al. | 365/233 |
|---|---|---|---|---|
| 5,812,490 | | 9/1998 | Tsukude | 365/233 |
| 5,841,730 | | 11/1998 | Kai et al. | 365/233 |
| 5,867,446 | * | 2/1999 | Konishi et al. | 365/233 |
| 6,097,404 | * | 4/2000 | Satoh et al. | 345/521 |

* cited by examiner

*Primary Examiner*—Vu A. Le
*Assistant Examiner*—Tuan T. Nguyen
(74) *Attorney, Agent, or Firm*—Herbert L. Lerner; Laurence A. Greenberg; Werner H. Stemer

(57) ABSTRACT

A memory has data lines through which data connections are connected to groups of memory cells via a synchronizing unit. The synchronizing unit is disposed adjacent to the cell group and has a clock input to which an internal clock signal is fed. In the event of a write access to the memory, the synchronizing unit synchronizes with the internal clock signal data signals that are fed via the data connections and are synchronous with an external clock signal.

4 Claims, 1 Drawing Sheet

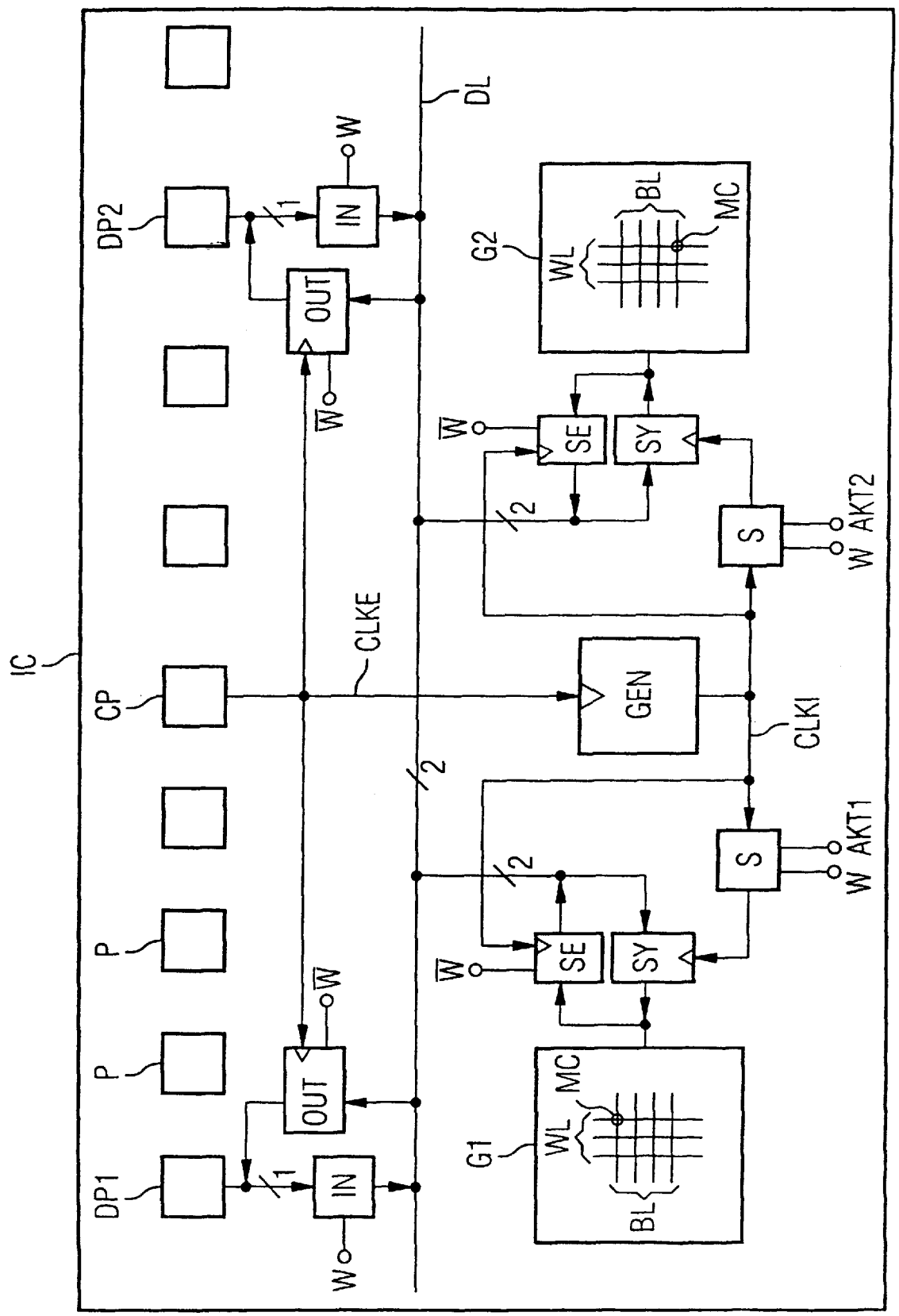

SYNCHRONOUS INTEGRATED MEMORY

BACKGROUND OF THE INVENTION

FIELD OF THE INVENTION

The invention relates to a synchronous integrated memory.

Synchronous memories are distinguished by the fact that data to be written are fed synchronously with an external clock signal and data to be read are output synchronously with the external clock signal. The processing within the memory often takes place with an internal clock signal that differs from the external clock signal. Data to be transferred are usually resynchronized from the external clock signal to the internal clock signal, or vice versa, directly at data connections of the memory, via which data connections the data are received from outside the memory or are output to outside the memory. For this purpose, corresponding synchronizing units are disposed directly adjacent to the data connections. In the event of a write access to the memory, data which are to be written and arrive externally at the data connections synchronously with the external clock signal are resynchronized with the internal clock signal by the synchronizing units before they are fed on corresponding data buses to a cell array within the memory, in order to be stored in memory cells.

The external connections of the memory and thus also its data connections are usually disposed in edge regions of the memory. In the event of a write access, a data bit to be written is transferred from each data connection to the corresponding cell array, in order to be stored there. Since the distances between the individual data connections and the cell array are generally different, the data signals that are communicated in the event of the write access experience propagation delay differences between the various data connections, where the signals are synchronized with the internal clock signal, and the cell array. These propagation delay differences become increasingly apparent at high clock frequencies, which are sought in particular for future memories.

SUMMARY OF THE INVENTION

It is accordingly an object of the invention to provide a syrnchronous integrated memory that overcomes the above-mentioned disadvantages of the prior art devices of this general type, in which the aforementioned propagation delay differences between the data bits to be written which are transferred to the memory cell array are advantageously avoided.

With the foregoing and other objects in view there is provided, in accordance with the invention, a synchronous integrated memory containing a group of memory cells disposed adjacent to one another. At least two data connections for feeding in data signals that are synchronized with an external clock signal are provided. A clock generator is provided having a clock output and generating an internal clock signal available at the clock output. Data lines are connected to the data connections. A synchronizing unit is disposed adjacent to the group of memory cells. The synchronizing unit is connected to the group of memory cells and to the data lines and through which the group of memory cells is connected to the data connections. The synchronizing unit has a clock input connected to the clock output of the clock generator, and, in an event of a write access, synchronizes the data signals that have been fed through the data connections and the data lines with the internal clock signal and feeds the data signals to the group of memory cells.

According to the invention, the synchronizing unit which is provided for resynchronizing the internal clock signal to the data signals fed with the external clock signal to the data connections of the memory is disposed directly adjacent to the memory cell group to which the data communicated with the data signals are intended to be written. Therefore, the data signals received from two data connections which, under certain circumstances, are spatially far apart are transferred maintaining synchronism with the external clock signal from the data connections via the data lines to the cell group. Resynchronization of the data signals from the external clock signal to the internal clock signals by the synchronizing unit does not take place until directly at the cell group. This has the advantage that both data signals which are fed to the memory via different data connections are communicated synchronously with the internal clock signal and without propagation delay differences to the cell group and thus to the memory cells situated therein. The invention can be applied to all writeable synchronous integrated memories, for example to synchronous dynamic random access memories (DRAMs).

The invention has the further advantage that the internal clock signal generated by the clock generator is fed only to the clock input of the synchronizing unit disposed adjacent to the cell group. Whereas, in conventional synchronous memories in which the resynchronization to the internal clock signal is effected at the respective data connection, corresponding synchronizing units are present at each data connection and the internal clock signal has to be fed to each of the units. The corresponding clock generator for the internal clock signal is usually disposed in the center of the integrated memory. In the conventional, decentralized configuration of the synchronizing units at each data connection, the internal clock signal generated by the clock generator has to be fed to each of the synchronizing units. This necessitates long clock lines for the feeding of the internal clock signal, which clock lines are additionally highly ramified as well, particularly if there are a large number of data connections via which data signals are transferred simultaneously to the memory. However, long and highly ramified clock lines lead to a disadvantageous loading on the clock output of the clock generator. This severe loading on the clock generator is avoided by the invention since the synchronizing unit according to the invention is disposed at the cell group and not at the edge of the memory, as is usually the case with the data connections. Moreover, in the case of the invention, only one synchronizing unit is necessary per memory cell group, whereas one synchronizing unit is necessary per data connection in the case of conventional synchronous memories. Since many memories have a large number of data connections, the internal clock signal has to be fed to a large number of data connections in the case of conventional memories, which results in corresponding ramification of the clock lines. By contrast, the memory cells of the memory according to the invention can be combined to form the cell groups such that only a smaller number of synchronizing units is necessary. The groups of memory cells may, for example, be memory cell blocks or multiples of memory cell blocks.

In conventional memories the internal clock signal generated by the clock generator must first be communicated to the synchronizing units disposed at the data connections before the resynchronization of the arriving data signals to the internal clock signal can be effected there. In the case of the invention, by contrast, the synchronizing unit is disposed directly at the cell group and therefore generally has a shorter distance from the clock generator than the data connections. Consequently, the propagation delay of the internal clock signal from the output of the clock generator to the synchronizing unit is shorter than in conventional memories. This enables faster operation of the memory. Furthermore, the data signals to be written are transferred synchronously with the external clock signal from the data connections via the data lines to the synchronizing unit, while the internal clock signal is simultaneously transferred from the clock generator to the synchronizing unit. Therefore, the data to be written have already covered the greatest part of the distance between the data connections and the cell group before the resynchronization to the internal clock signal takes place. This also accelerates the write access in the memory according to the invention.

In accordance with an added feature of the invention, the integrated memory has a further group of memory cells disposed adjacent to one another. A further synchronizing unit is connected to the further group of memory cells and to the data line and through which the data lines are connected to the further group of memory cells. The further synchronizing unit has a clock input connected to the clock output of the clock generator.

In accordance with an additional feature of the invention, the integrated memory includes switching units each having an input connected to the clock output of the clock generator and an output connected to the clock input of one of the synchronizing unit and the further synchronizing unit. The switching units each have an activation input and can be activated in the event of the write access and can be deactivated in an event of a read access. In which case the switching units forward the internal clock signal, received at the input of the switching units to the output of the switching units only in an activated state.

In accordance with a concomitant feature of the invention, the integrated memory includes switching units each having an input connected to the clock output of the clock generator and an output connected to the clock input of the synchronizing unit or the further synchronizing unit. The switching units each have an activation input and can be activated in an event of an access to a corresponding one of the group of memory cells and the further group of memory cells. The switching units can otherwise be deactivated in which case the switching units forward the internal clock signal received at the input of the switching units to the output of the switching units only in an activated state.

Other features which are considered as characteristic for the invention are set forth in the appended claims.

Although the invention is illustrated and described herein as embodied in a synchronous integrated memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The single FIGURE of the drawing is a block circuit diagram of a memory according to the invention.

DESCRIPTION OF THE PREFERRED EMBODIMENTS

Referring now to the single FIGURE of the drawing in detail, there is shown an integrated memory IC that is a writeable synchronous memory of the DRAM type. The memory IC has a row of contact areas P, CP, DP1, DP2 at one of its edges. One of the contact areas is a clock connection CP and two are data connections DP1, DP2. The memory has two groups G1, G2 of memory cells MC. The cell groups G1, G2 are cell arrays of the memory. The memory cells MC are disposed at crossover points of word lines WL and bit lines BL. The memory IC has data lines DL, via which the data connections DPi are respectively connected to the two cell groups G1, G2. The data lines DL are combined to form a bi-directional data bus. In practice, a memory of this type contains a considerably larger number of data connections. For a simplified illustration, only two data connections DP1, DP2 have been depicted in this case.

Each data connection DPi is connected to the corresponding data line DL through an input circuit IN. The input circuits IN are activated via a control input only when a write access is made to the memory IC. For this purpose, control inputs of the input circuits IN are connected to a writing control signal W. A respective synchronizing unit SY is disposed directly adjacent to the cell groups Gi, via which synchronizing unit SY both data lines DL are respectively connected to the corresponding cell group Gi.

The memory IC furthermore has a clock generator GEN, which is disposed in a centralized manner in its center and has a clock input connected to the clock connection CP, and a clock output connected via a respective switching unit S to a clock input of each of the synchronizing units SY. An external clock signal CLKE is fed to the clock generator GEN via the clock connection CP, data signals that are fed in via the data connections DPi in the event of a write access being synchronous with the external clock signal CLKE. The clock generator GEN generates an internal clock signal CLKI from the external clock signal CLKE. In the event of a write access, the input circuits IN are active and transfer data signals that are synchronous with the external clock signal CLKE from the data connections DPi to both synchronizing units SY. The synchronizing units SY, to which the internal clock signal CLKI is fed, synchronize with the internal clock signal CLKI the data signals that are fed to them by the input circuits IN, and subsequently feed them to the memory cells MC of the respective cell group Gi.

The clock generator GEN is not connected directly to the clock inputs of the synchronizing units SY but through the switching units S. The switching units S have a first control input connected to the writing control signal W, and a second control input connected to a respective activation signal AKT1, AKT2. The switching units S forward the internal clock signal CLKI at their input to the associated synchronizing unit SY only when a write access to the corresponding cell group G1, G2 is made to the memory IC. Therefore, each switching unit S is activated only when the associated activation signal AKTi indicates a write access to the respective cell group. Unless the writing control signal W and the activation signal AKTi of the respective switching unit S simultaneously have a high level, the switching unit S does not forward the internal clock signal CLKI to the synchronizing unit SY, but rather generates merely a fixed level, for example ground level, at its output. In the case of this fixed level, the corresponding synchronizing units SY does not forward data signals that are present at its input to the cell group Gi. Resynchronization of the data signals with the internal clock signal CLKI by the synchronizing unit SY is effected only when the latter is fed the internal clock signal CLKI from the associated switching unit S. The clock signal which is fed to the clock input of the synchronizing unit SY is thus a special information-carrying internal clock signal containing additional items of information which are derived from the writing control signal W and the activation signals AKTi. Therefore, further logic elements which enable a data transfer to the memory cells MC only in the event of a write access and only in the event of access to the memory cells of the relevant cell group Gi dose not have to be provided in the data path between the synchronizing units SY and the cell groups Gi. This functionality is already ensured by the synchronizing units SY and the switching units S.

The cell groups Gi are connected to the data lines DL through a respective switching unit SE. The switching units SE have a control input connected to the inverted writing control signal /W. Moreover, each data line DL is connected to one of the data connections DPi via a respective output circuit OUT. The output circuits OUT likewise have a control input connected to the inverted writing control signal /W, and a clock signal connected to the clock connection CP, with the result that the external clock signal CLKE is also fed to the output circuits OUT. The switching units SE and the output circuits OUT are active only in the event of read accesses to the memory IC, that is to say when the inverted writing control signal /W has a high level. The switching units SE each have a clock input connected to the clock output of the clock generator GEN. The switching units SE output data read from the memory cells MC synchronously with the internal clock signal CLKI onto the data lines DL, which transfer them to the output circuits OUT. The output circuits OUT synchronize the corresponding data signals with the external clock signal CLKE and output them to the data connections DPi.

The memory IC shown in the figure differs from conventional synchronous memories in that although data signals to be read out are synchronized by the output circuits OUT directly at the data connections DPi, data signals to be written are synchronized with the internal clock signal CLKI by the synchronizing units SY in direct proximity to the memory cells MC. There is thus a spatial separation of the synchronization of the data to be transferred for both transfer directions.

In other exemplary embodiments, the clock input of the output circuits OUT can also not be connected directly to the external clock signal CLKE, but rather to a clock signal which is derived from the latter and ensures synchronism of the data to be read out at the data connections DPi with the external clock signal CLKE.

We claim:
1. A synchronous integrated memory, comprising:
a group of memory cells disposed adjacent to one another;
at least two data connections for feeding in data signals synchronized with an external clock signal;
a clock generator having a clock output and generating an internal clock signal available at said clock output;
data lines connected to said data connections; and
a synchronizing unit disposed adjacent to said group of memory cells, said synchronizing unit connected to said group of memory cells and to said data lines and through which said group of memory cells being connected to said data connections, said synchronizing unit having a clock input connected to said clock output of said clock generator, and, in an event of a write access, synchronizes the data signals that have been fed through said data connections and said data lines with the internal clock signal and feeds the data signals to said group of memory cells.

2. The synchronous integrated memory according to claim 1, including:
a further group of memory cells disposed adjacent to one another; and
a further synchronizing unit connected to said further group of memory cells and to said data line and through which the data lines are connected to said further group of memory cells, said further synchronizing unit having a clock input connected to said clock output of said clock generator.

3. The synchronous integrated memory according to claim 2, including:
switching units each having an input connected to said clock output of said clock generator and an output connected to said clock input of one of said synchronizing unit and said further synchronizing unit, said switching units each having an activation input and can be activated in the event of the write access and can be deactivated in an event of a read access, in which case said switching units forward the internal clock signal, received at said input of said switching units to said output of said switching units only in an activated state.

4. The synchronous integrated memory according to claim 2, including:
switching units each having an input connected to said clock output of said clock generator and an output connected to said clock input of one of said synchronizing unit and said further synchronizing unit, said switching units each having an activation input and can be activated in an event of an access to a corresponding one of said group of memory cells and said further group of memory cells, and said switching units can otherwise be deactivated in which case said switching units forward the internal clock signal received at said input of said switching units to said output of said switching units only in an activated state.

* * * * *